United States Patent

Hu et al.

[11] Patent Number: 5,856,698
[45] Date of Patent: Jan. 5, 1999

[54] SECOND IMPLANTED MATRIX FOR AGGLOMERATION CONTROL AND THERMAL STABILITY

[75] Inventors: Yong-Jun Hu; Pai-Hung Pan; Mark Klare, all of Boise, Id.

[73] Assignee: Micron Technology, Inc., Boise, Id.

[21] Appl. No.: 959,238

[22] Filed: Oct. 28, 1997

Related U.S. Application Data

[62] Division of Ser. No. 764,685, Nov. 27, 1996, Pat. No. 5,739,064.

[51] Int. Cl.$^6$ .................................................. H01L 29/76
[52] U.S. Cl. .......................... 257/412; 257/611; 257/612
[58] Field of Search .................... 257/412, 610, 257/611, 612, 768, 769, 770

[56] References Cited

U.S. PATENT DOCUMENTS

| | | | |
|---|---|---|---|
| 4,682,407 | 7/1987 | Wilson | 438/517 |
| 5,313,087 | 5/1994 | Chan et al. | 257/538 |
| 5,384,485 | 1/1995 | Nishida et al. | 257/751 |
| 5,633,177 | 5/1997 | Anjum | 438/301 |
| 5,637,533 | 6/1997 | Choi | 438/643 |
| 5,776,823 | 7/1998 | Agnello et al. | 438/592 |

*Primary Examiner*—Sara Crane
*Attorney, Agent, or Firm*—Workman, Nydegger & Seeley

[57] ABSTRACT

A semiconductor device on a semiconductor wafer, wherein improvements are realized to agglomeration control, resistivity, and thermal stability of a titanium disilicide layer on a polysilicon layer. Agglomeration control is achieved through the use of two carefully selected low dose barrier diffusion matrix implants into the polysilicon layer, one of which is situated at an interface between the layer of polysilicon and the resultant layer of titanium disilicide film after heat treatment, and the other of which is near the surface of the resultant layer of titanium disilicide film after heat treatment.

19 Claims, 1 Drawing Sheet ns of agglomeration are complex and varied, it is widely accepted that a major contributing factor to agglomeration is the action of polysilicon grain boundaries as rapid diffusion routes for transporting silicon and/or dopant ions which diffuse out from the polysilicon during annealing. Silicon which out-diffuses from the polysilicon layer and then recrystallizes at the $TiSi_2$-polysilicon interface can cause severe discontinuities and voids within the $TiSi_2$ layer, resulting in higher sheet resistivity of the silicide with greater variation in resistivity and a greater number of defects.

SECOND IMPLANTED MATRIX FOR AGGLOMERATION CONTROL AND THERMAL STABILITY

This application is a divisional of application Ser. No. 08/764,685, filed on Nov. 27, 1996, U.S. Pat. No. 5,739,064.

BACKGROUND OF THE INVENTION

1. The Field of the Invention

The present invention relates the manufacture of semiconductor devices. More particularly, the present invention relates to a semiconductor wafer having semiconductor devices thereon, the semiconductor wafer having a substrate subjected to a series of processing steps for forming silicide films on monocrystalline amorphous, or polycrystalline silicon, the processing steps serving to reduce interfacial failures on the wafer due to agglomeration within the silicide films during high temperature anneal processing steps.

2. The Relevant Technology

As is well known in the art, polycrystalline silicon (polysilicon) is a preferred material for gate electrodes in MOSFET structures. Polysilicon is advantageous over metal gate electrodes because it can withstand much higher subsequent processing temperatures before eutectic temperatures are reached. Polysilicon can be deposited on bulk silicon or $SiO_2$ using low pressure chemical vapor deposition (LPCVD).

As the drive toward integrating more active devices on a single integrated circuit necessitates the fabrication of increasingly smaller MOSFET structures, the resistance of the MOSFET gate becomes a limiting factor in device speed. As such, it is beneficial to use materials with the lowest possible sheet resistivities for making contact with the polysilicon gate structure. To this end it is well known that refractory metal silicides can be readily formed on polysilicon MOSFET gate structures using conventional semiconductor deposition and annealing techniques. The refractory metal silicides have low sheet resistivities after annealing and also form low resistance ohmic contacts with commonly used interconnect metals. The resistance of the silicide/polysilicon structures and their overall integrity are greatly affected by the manner in which the structures are processed.

Titanium silicide ($TiSi_2$) has a low sheet resistivity when it has been annealed to a C54 phase. To obtain the desired low resistivities requires high temperature annealing in the range of 700°–1100° C. Numerous techniques for creating and annealing $TiSi_2$ films on MOSFET gate source and drain electrodes are known, and for obtaining the desired low sheet resistivities. The most common of these techniques involves depositing either pure titanium metal, or co-depositing titanium silicide ($TiSi_2$), with subsequent annealing steps to convert the deposited layer to $TiSi_2$ in a C54 phase.

The use of $TiSi_2$ in silicon gate MOSFET fabrication is becoming limited by insufficient process stability at the desired processing temperatures. This instability creates a problem as the trend toward more complex integrated circuits necessitates an increasing number of high temperature processing steps after the deposition and formation of the silicide layer. An unwanted side effect of the high temperature instability of $TiSi_2$ is caused by agglomeration, which is known to occur during high temperature polysilicon processing. Agglomeration is a build-up of re-crystallized silicon, metal, or dopant grains at either or both of the interfaces of the polysilicon layer, and typically occurs during high-temperature annealing. Although the mecha- As it is known in the art that high-temperature annealing is required to achieve the minimum possible room-temperature resistivity of any given silicide, it is clear that advances are needed which will better control the mechanical and electrical stability of refractory metal silicide films (e.g. $TiSi_2$) during high-temperature silicide formation and annealing. Accordingly, it would be an advance in the art to avoid agglomeration, develop superior sheet resistivity and device speed, and increase thermal stability characteristics in refractory metal silicide films.

SUMMARY OF THE INVENTION

Processing steps that overcome the above-mentioned side effects of high-temperature annealing are part of a semiconductor fabrication method of the present invention. A silicon layer, either monocrystalline silicon, amorphous silicon or polysilicon, is deposited on a silicon substrate. A first diffusion barrier matrix is implanted at a specific depth within the silicon layer. A second diffusion barrier matrix is implanted at the surface of the silicon layer. A layer of refractory metal is sputtered on the silicon layer and then a first salicidation anneal is performed at high a temperature. The refractory metal that does not form metal silicide is selectively etched and a second salicidation anneal is performed at a high temperature.

As will be shown in the sections that follow, by proper selection of the elements, concentrations, and implant depths of the above mentioned diffusion barrier matrices, refractory metal silicide, polycide, and salicide structures can be created. The first diffusion barrier matrix is implanted at a depth within the polysilicon layer where the interface between the refractory metal silicide and the polysilicon will be. This has the effect that the refractory metal silicide layer will not break down at the interface of the polysilicon layer into silicon and the refractory metal. The implanting of the second diffusion barrier matrix at the surface of the polysilicon layer controls salicidation to produce a smooth refractory metal silicide film on the surface. As result of this method the structure has superior resistivity and thermal stability characteristics.

These and other aspects of the invention will become apparent to those skilled in the art after referring to the following description and examples.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Additional advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

An invention of processing steps is disclosed which significantly reduce the resistivity and increase thermal stability of annealed refractory metal silicide films. The processing steps reduce agglomeration at the interface of the refractory metal silicide film and an underlying layer of polysilicon or silicon.

The processing steps are useful as part of a general method for fabrication of MOSFET structures, a preferred embodiment of which is disclosed below. In the following description, numerous details are set forth, such as specific materials, process parameters, etc., in order to provide a thorough understanding of the present invention. It will be obvious to one skilled in the art, however, that these specific details need not be employed precisely as described to practice the present invention. In other instances, well-known processing steps are not described in detail so as not to detract from the various details of the embodiments of the invention.

Figure 1:
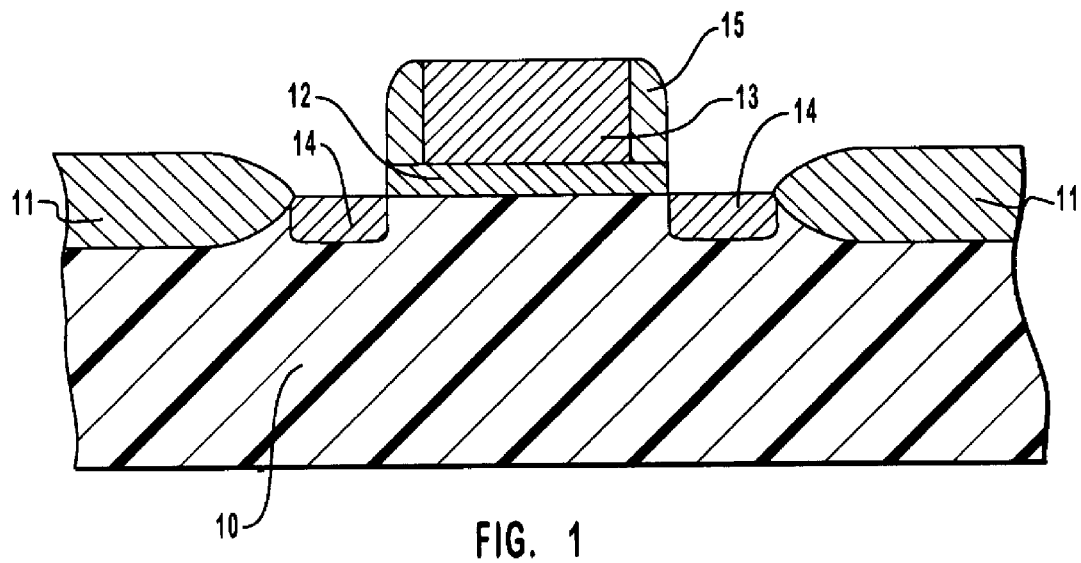
FIG. 1–3 are simplified cross sectional schematics showing an example of the developments of a MOSFET gate structure as pertains to this invention.

In an embodiment of the present invention, referring to FIG. 1, a thermally grown field oxide film 11 is formed on a P-type or N-type silicon substrate 10 with exposed active areas corresponding to the geometries of the MOSFET structures that are to be fabricated. After cleaning, an insulating film 12, typically $SiO_2$, is grown on the entire exposed surface of the substrate. A polysilicon layer 13 is then deposited over the insulating film, preferably using LPCVD. Other methods for depositing polysilicon layer include PECVD (pressure enhanced chemical vapor deposition), APCVD (atmospheric pressure chemical vapor deposition), and sputtering. Polysilicon layer 13 is formed according to one of the foregoing processes at a temperature in a range from about 50° C. to about 900° C.

Figure 2:
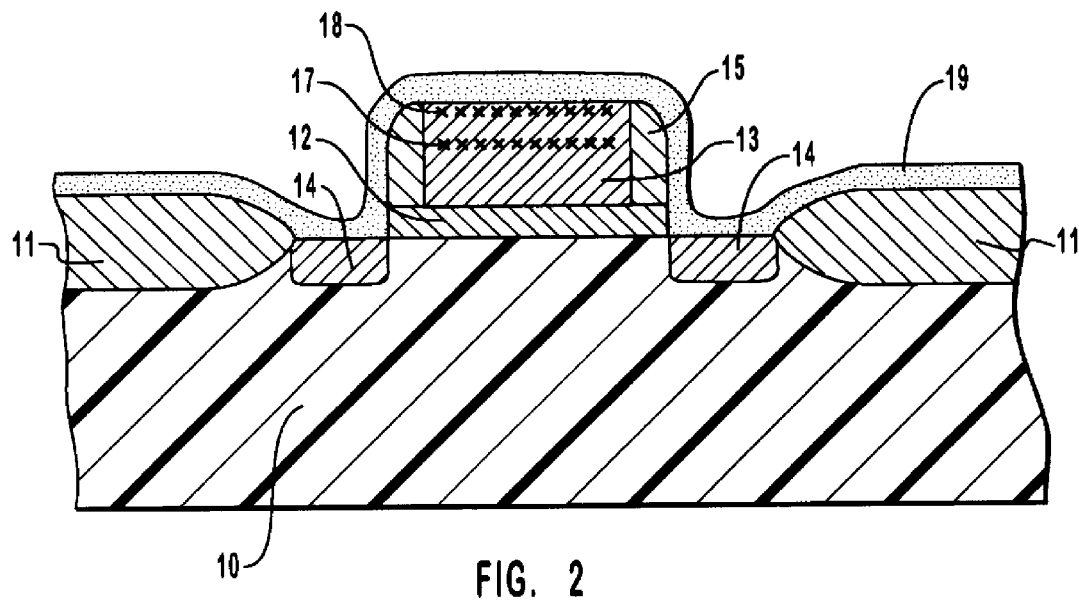

Referring to FIG. 2, a first diffusion barrier matrix 17 is then implanted within polysilicon layer 13 with nitrogen. First diffusion barrier matrix 17 is implanted at a predetermined depth range corresponding to where the interface will be situated between polysilicon layer 13 and a layer of titanium silicide to be formed after a subsequent annealing step. In the preferred embodiment, first diffusion barrier matrix 17 is a $2\times10^{13}$ $cm^{-2}$ $_{14}N^+$ implant dose at an energy of about 22 KeV, although other dopants such as phosphorus, or metals such as molybdenum, tungsten, or cobalt could also be used. Other dopant concentrations could also be used but a low dose close to the value stated herein is preferable. First diffusion barrier matrix 17 is used to limit the diffusion of silicon along columnar grain boundaries which form in the polysilicon layer during annealing. Ion implantation is conducted by providing an ion source from which the implanted ions are generated. The ion source may be, for example, phosphorus, nitrogen, or other suitable materials contemplated by the invention.

The wafer is then patterned and insulating film 12 and polysilicon layer 13 are etched to form a polysilicon gate structure consisting of a gate oxide layer 12 and a polysilicon gate layer 13. Insulating side wall spacers 15 are then formed by conventional processing.

A second matrix 18 is then implanted in the surface. Second matrix 18 may comprise, for example, nitrogen ions. Alternatively, other materials, such as phosphorus ions, molybdenum ions, tungsten ions, or cobalt ions may be used in second matrix 18. The primary function of this step is to control salicidation and for silicide surface smoothing on the surface. The first and second implanted matrixes assist a smooth silicide/polysilicon interface and a smooth silicide surface, respectively.

A metallization layer 19 of Ti material is next deposited on polysilicon layer 13 using a standard PVD process. The PVD process is conducted in a temperature range of between 100° C. and 300° C. Alternatively, metallization layer 19 may also be a refractory metal material that is next deposited on polysilicon gate layer 13 preferably using a standard PVD process. Refractory metal materials according to the present invention include at least titanium, tungsten, cobalt, and molybdenum and combinations thereof.

The structure is then subjected to a salicidation anneal. A first salicidation anneal is performed in nitrogen at 750° C. for 20 seconds. A conventional blanket etch is then performed to remove all unreacted titanium metal from the top layer that did not form polycide or salicide structures. A second salicidation anneal is then performed in nitrogen at 825° C. for 10 seconds to fully convert all of the remaining silicide structures to the C54 phase. Alternatively, the anneals may be conducted according to other process parameters. For example, an anneal may include rapid thermal processing at about 1,000° C. for about 20 seconds.

Figure 3:
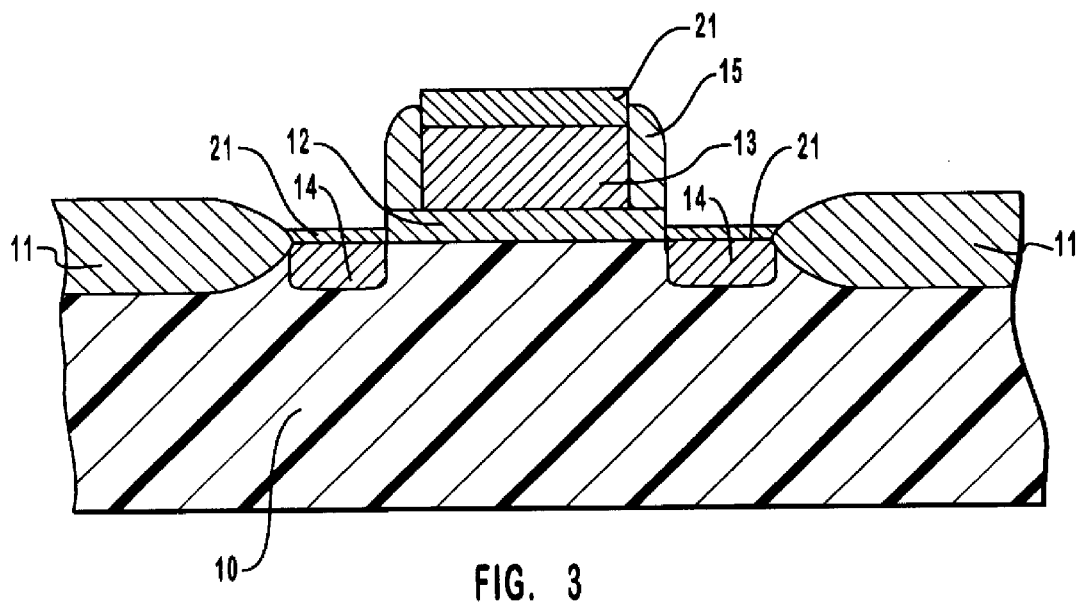

The overall finished MOSFET gate structure appears as shown in FIG. 3. Metallization layer 19 of FIG. 2 has combined with polysilicon gate layer 13 to form a polycide gate layer 21, on top of unreacted silicon. The gate structure includes active regions that form source and drain regions. Results of the foregoing steps reveal a smooth film surface and a smooth interface as demonstrated by resistivity tests. In a preferred embodiment of the present invention, field oxide film 11 has a thickness in a range from about 1,000 Å to about 3,000 Å, insulating film 12 has a thickness in a range from about 50 Å to about 150 Å, polysilicon layer 13 has a thickness in a range from about 1,000 Å to about 2,000 Å, and refractory metal silicide layer 21 has a thickness in a range from about 500 Å to about 2,000 Å. In a preferred embodiment, first diffusion barrier matrix 17 is implanted in polysilicon layer 13 at a predetermined depth in a range from about 200 Å to about 1,000 Å.

EXAMPLES

The following examples are provided for illustration purposes and are not intended to be restrictive of the scope and spirit of the present invention. Table A illustrates a series of tests in which one or more ion dopant implantations were made previous to forming into a structure of a layer of $TiSi_2$ above and on a layer of polysilicon, the layer of polysilicon being above and on a gate oxide that is in turn above and on a P-type silicon substrate. In the Test Nos. 1–3, second and first implant matrices were implanted, respectively, into the polysilicon layer at the surface and the eventual $TiSi_2$- polysilicon interface. Table A illustrates that Tests Nos. 1–3 demonstrate a controlled low-level resistivity. A series of comparative examples (Tests Nos. C1–C7) illustrate that single implant at the surface of the polysilicon, while controlling salicidations of TiSi$_2$, do not achieve the desired low resistivity.

TABLE A

| Test No. | TiS$_{ix}$ depth, angstroms | 1st implant | 2nd implant | Rs after RTP anneal, ohms/square | | | |
|---|---|---|---|---|---|---|---|
| | | | | 0 | 1 | 2 | 3 |
| 1 | 700 | N[4,9] | N[6,9] | 2.41 | 2.93 | 3.90 | 5.49 |
| 2 | 650 | N[4,9] | N[6,9] | 1.90 | 2.22 | 3.18 | 4.96 |
| 3 | 700 | N[4,9] | P[1,9] | 2.36 | 2.83 | 3.68 | 5.15 |
| C1 | 700 | W[2,7] | | 2.34 | 4.89 | 7.29 | 10.39 |
| C2 | 700 | Co[6,7] | | 2.55 | 4.06 | 5.72 | 8.06 |
| C3 | 700 | Co[6,8] | | 2.32 | 4.17 | 6.16 | 8.91 |
| C4 | 430 | W[2,7] | | 3.90 | 10.48 | 18.54 | 37.67 |
| C5 | 430 | W[2,10] | | 3.88 | 8.80 | 14.24 | 23.17 |
| C6 | 430 | Mo[3,7] | | 3.75 | 9.69 | 16.73 | 34.28 |
| C7 | 420 | Co[5,7] | | 4.13 | 10.03 | 15.73 | 27.17 |

[1]60 KeV, [2]50 KeV, [3]45KeV, [4]22KeV, [5]15KeV, [6]12KeV, [7]1E14/cm$^2$, [8]5E12/cm$^2$, [9]2E13/cm$^2$, [10]2E12/cm$^2$

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes that come within the meaning and range of equivalency of the claims are to be embraced within their scope.

What is claimed and desired to be secured by United States Letters Patent is:

1. A semiconductor device structure situated on a semiconductor wafer and comprising:
    a silicon layer situated over said semiconductor wafer;
    a metallization layer comprising a refractory metal silicide over said silicon layer;
    a first diffusion barrier matrix comprising a plurality of first ions implanted within said semiconductor device structure so as to substantially define an interface between said silicon layer and said metallization layer; and
    a second diffusion barrier matrix comprising a plurality of second ions situated below a top surface of said metallization layer, said second diffusion barrier matrix being separated from and positioned over said first diffusion barrier matrix.

2. The semiconductor device structure as defined in claim 1, further comprising an oxide layer on a silicon substrate of said semiconductor wafer and under said silicon layer.

3. The semiconductor device structure as defined in claim 2, wherein said silicon layer is substantially composed of polysilicon and is patterned into a polysilicon gate layer, said metallization layer is patterned so as to cover the top of said polysilicon gate layer, and said oxide layer is patterned into a gate oxide layer beneath said polysilicon gate layer, said metallization layer extending laterally upon said polysilicon gate layer to terminate at a side wall spacer, said gate oxide layer extending laterally beneath said polysilicon gate layer to terminate at said side wall spacer, said side wall spacer making contact with said gate oxide layer, said polysilicon gate layer, and said metallization layer, said side wall spacer extending laterally to a refractory metal silicide layer situated on said silicon substrate, said refractory metal silicide layer extending laterally from said side wall spacer to a field oxide region situated on said silicon substrate.

4. The semiconductor device structure as defined in claim 3, wherein said metallization layer comprises titanium.

5. The semiconductor device structure as defined in claim 1, wherein said first and second diffusion barrier matrices comprise elements selected from the group consisting of P, N, Co, W, and Mo, and combinations thereof.

6. The semiconductor device structure as defined in claim 1, wherein said first diffusion barrier matrix comprises phosphorus ions, and said second diffusion barrier matrix comprises nitrogen ions.

7. An MOS device structure situated on a semiconductor wafer and comprising:
    a gate stack situated over said semiconductor wafer, said gate stack including:
        a gate oxide layer over said semiconductor wafer;
        a polysilicon gate layer on said gate oxide layer;
        a metallization layer over said polysilicon gate layer;
        a first diffusion barrier matrix comprising a plurality of first ions implanted within said MOS device structure so as to substantially define an interface between said polysilicon gate layer and said metallization layer; and
        a second diffusion barrier matrix comprising a plurality of second ions situated below a top surface of said metallization layer, said second diffusion barrier matrix being separated from and positioned over said first diffusion barrier matrix;
    a side wall spacer, wherein said metallization layer, said polysilicon gate layer, and said gate oxide layer all extend laterally to terminate at said side wall spacer, said side wall spacer making contact with said gate oxide layer, said polysilicon gate layer, and said metallization layer;
    a refractory metal silicide layer situated on a source/drain region within a silicon substrate on said semiconductor wafer, said side wall spacer extending laterally to said refractory metal silicide layer; and
    a field oxide region situated on said silicon substrate, said refractory metal silicide layer extending laterally from said side wall spacer to said field oxide region.

8. The MOS device structure as defined in claim 7, wherein said first and second diffusion barrier matrices comprise elements selected from the group consisting of P, N, Co, W, and Mo, and combinations thereof.

9. The MOS device structure as defined in claim 7, wherein said first diffusion barrier matrix comprises phosphorus ions at a concentration of about $2\times10^{13}$ ions/cm$^2$, and said second barrier matrix comprises nitrogen ions at a concentration of about $2\times10^{13}$ ions/cm$^2$.

10. An MOS device structure situated on a semiconductor wafer and comprising:
    a gate stack situated over said semiconductor wafer, said gate stack including:
        a gate oxide layer over said semiconductor wafer;
        a polysilicon gate layer on said gate oxide layer;
        a titanium silicide layer over said polysilicon gate layer;
        a first diffusion barrier matrix comprising phosphorus ions implanted within said MOS device structure so as to substantially define an interface between said polysilicon gate layer and said titanium silicide layer: and
        a second diffusion barrier matrix comprising nitrogen ions situated below a top surface of said metallization layers said second diffusion barrier matrix being separated from and positioned over said first diffusion barrier matrix;

a side wall spacer, wherein said titanium silicide layer, said polysilicon gate layer, and said gate oxide layer all extend laterally to terminate at said side wall spacer, said side wall spacer making contact with said gate oxide layer, said polysilicon gate layer, and said titanium silicide layer;

a titanium silicide contact layer situated on a source/drain region within a silicon substrate on said semiconductor wafer, said side wall spacer extending laterally to said titanium silicide contact layer; and a field oxide region situated on said silicon substrate, said titanium silicide contact layer extending laterally from said side wall spacer to said field oxide region.

11. A semiconductor device structure as defined in claim 1, wherein said silicon layer comprises a material selected from the group consisting of monocrystalline silicon, amorphous silicon, and polysilicon.

12. A semiconductor device structure as defined in claim 1, wherein said metallization layer comprises a material selected from the group consisting of Ti, W, Co, and Mo, and combinations thereof.

13. A semiconductor device structure as defined in claim 1, wherein said first diffusion barrier matrix comprises nitrogen ions.

14. A semiconductor device structure as defined in claim 1, wherein said phosphorus ions are positioned within said first diffusion barrier matrix at a concentration of about $2 \times 10^{13}$ ions/cm$^2$.

15. A semiconductor device structure as defined in claim 1, wherein said nitrogen ions are positioned within said second diffusion barrier matrix at a concentration of about $2 \times 10^{13}$ ions/cm$^2$.

16. A semiconductor device structure as defined in claim 3, wherein:

said field oxide region has a thickness in a range from about 1,000 Å to about 3,000 Å;

said gate oxide layer has a thickness in a range from about 50 Å to about 150 Å; and said metallization layer has a thickness in a range from about 500 Å to about 2,000 Å.

17. An MOS device structure as defined in claim 10, wherein:

said phosphorus ions are positioned within said first diffusion barrier matrix at a concentration of about $2 \times 10^{13}$ ions/cm$^2$; and said nitrogen ions are positioned within said second diffusion barrier matrix at a concentration of about $2 \times 10^{13}$ ions/cm$^2$.

18. A semiconductor device structure situated on a semiconductor wafer and comprising:

a gate structure situated over said semiconductor wafer, said gate structure including:

a gate oxide layer over said semiconductor wafer, said gate oxide layer having a thickness in a range from about 50 Å to about 150 Å;

a silicon gate layer on said gate oxide layer, said silicon gate layer being substantially composed of a material selected from the group consisting of monocrystalline silicon, amorphous silicon, and polysilicon;

a metallization layer over said silicon gate layer, said metallization layer comprising a silicide of a refractory metal selected from the group consisting of titanium, tungsten, cobalt, molybdenum, and combinations thereof, said metallization layer having a thickness in a range from about 500 Å to about 2,000 Å;

a first diffusion barrier matrix comprising first ions selected from the group consisting of phosphorus ions, nitrogen ions, cobalt ions, tungsten ions, and molybdenum ions, said first ions being implanted in said semiconductor device structure so as to substantially define an interface between said silicon gate layer and said metallization layer; and a second diffusion barrier matrix comprising second ions selected from the group consisting of phosphorus ions, nitrogen ions, cobalt ions, tungsten ions, and molybdenum ions, said second ions being situated below a top surface of said metallization layer, said second diffusion barrier matrix being separated from and positioned over said first diffusion barrier matrix;

a side wall spacer, wherein said metallization layer, said silicon gate layer, and said gate oxide layer all extend laterally to terminate at said side wall spacer, said side wall spacer making contact with said gate oxide layer, said silicon gate layer, and said metallization layer;

a refractory metal silicide contact layer situated on a source/drain region within a silicon substrate on said semiconductor wafer, said side wall spacer extending laterally to said refractory metal silicide contact layer; and a field oxide region situated on said silicon substrate, said refractory metal silicide contact layer extending laterally from said side wall spacer to said field oxide region, said field oxide region having a thickness in a range from about 1,000 Å to about 3,000 Å.

19. A semiconductor device structure as defined in claim 18, wherein said refractory metal of said metallization layer is also included in said refractory metal silicide layer.

* * * * *

UNITED STATES PATENT AND TRADEMARK OFFICE
CERTIFICATE OF CORRECTION

PATENT NO. : 5,856,698
DATED : Jan. 5, 1999
INVENTOR(S) : Yong-Jun Hu, Pai-Hung Pan, Mark Klare It is certified that error appears in the above-identified patent and that said Letters Patent are hereby corrected as shown below:

Col. 3, line 21, after "significantly" change "reduce" to --reduces--

Col. 3, line 21, before "thermal" change "increase" to --increases--

Col. 3, line 46, after "depositing" insert an --a--

Col. 3, line 50, after "temperature" insert --preferably--

Signed and Sealed this

Twenty-second Day of May, 2001

Attest:

NICHOLAS P. GODICI

Attesting Officer     Acting Director of the United States Patent and Trademark Office